(12) United States Patent
Miyata et al.

(10) Patent No.: US 9,041,056 B2
(45) Date of Patent: May 26, 2015

(54) SEMICONDUCTOR DEVICE AND METHOD OF MANUFACTURING SAME

(75) Inventors: Toshitaka Miyata, Yokohama (JP); Kanna Adachi, Chigasaki (JP); Shigeru Kawanaka, Yokohama (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 378 days.

(21) Appl. No.: 13/346,906

(22) Filed: Jan. 10, 2012

(65) Prior Publication Data

US 2012/0175637 A1 Jul. 12, 2012

(30) Foreign Application Priority Data

Jan. 12, 2011 (JP) .................................. 2011-003907

(51) Int. Cl.

| H01L 29/16 | (2006.01) |
|---|---|
| H01L 29/772 | (2006.01) |
| H01L 29/08 | (2006.01) |
| H01L 29/10 | (2006.01) |
| H01L 29/78 | (2006.01) |
| H01L 29/165 | (2006.01) |
| H01L 29/66 | (2006.01) |

(52) U.S. Cl.
CPC .......... H01L 29/772 (2013.01); H01L 29/0895 (2013.01); H01L 29/1054 (2013.01); H01L 29/1608 (2013.01); H01L 29/165 (2013.01); H01L 29/6656 (2013.01); H01L 29/7836 (2013.01)

(58) Field of Classification Search
None
See application file for complete search history.

(56) References Cited

U.S. PATENT DOCUMENTS

| 2003/0102490 A1* | 6/2003 | Kubo et al. .................... 257/192 |
| 2005/0258482 A1* | 11/2005 | Ito et al. ......................... 257/336 |
| 2006/0046399 A1* | 3/2006 | Lindert et al. ................. 438/282 |
| 2011/0275182 A1* | 11/2011 | Mouli ............................ 438/151 |

OTHER PUBLICATIONS

F. Mayer, et al., "Impact of SOI, $Si_{1-x}Ge_xOI$ and GeOI substrates on CMOS compatible Tunnel FET performance", IEDM, 2008, 5 pages.
Hiroo Fuma, et al., "Silicon Carbide Semiconductor", Toyota central R&D Labs review, vol. 30, No. 2, Jun. 1995, pp. 57-67.

* cited by examiner

*Primary Examiner* — Matthew W Such
*Assistant Examiner* — Abul Kalam
(74) *Attorney, Agent, or Firm* — Oblon, McClelland, Maier & Neustadt, L.L.P.

(57) ABSTRACT

According to one embodiment, a semiconductor device including: a substrate; a gate electrode formed above the substrate; a gate insulating film formed under the gate electrode; a channel layer formed under the gate insulating film by using a channel layer material; a source region and a drain region formed in the substrate so as to interpose the channel layer therebetween in a channel direction; and a source extension layer formed in the substrate between the channel layer and the source region so as to overlap a source-side end portion of the channel layer. The source extension layer forms a heterointerface with the channel layer. The heterointerface is a tunnel channel for carries.

9 Claims, 5 Drawing Sheets

US 9,041,056 B2

SEMICONDUCTOR DEVICE AND METHOD OF MANUFACTURING SAME

CROSS-REFERENCE TO RELATED APPLICATION

This application is based upon and claims the benefit of priority from prior Japanese Patent Application No. 2011-3907, filed on Jan. 12, 2011, the entire contents of which are incorporated herein by reference.

FIELD

Embodiments of the present invention relate to a semiconductor device and a method of manufacturing the semiconductor device.

BACKGROUND

Currently, in order to improve performance of logic type semiconductor integrated circuits such as a microprocessor or an ASIC (Application Specific Integrated Circuit) or to implement memory type semiconductor integrated circuits having large capacity or the like, miniaturization for reducing the size thereof has been performed on semiconductor elements constituting these integrated circuits.

More specifically, in the miniaturization of MOSFETs (Metal Oxide Semiconductor Field Effect Transistors) as semiconductor elements, fine lines (short channels) have been implemented in control gate electrodes, and at the same time, gate insulating films have been implemented as thin films. Accordingly, the problems occur in that an increase in a junction leak current, an increase in a random variation of a threshold value, and an increase in a gate tunnel leak current are caused due to a high concentration of channel impurities. In addition, although a technique of improving mobility of carriers in a channel by applying mechanical stress to a semiconductor element by using SiGe or the like is used in order to improve performance of the MOSFET element, this technique also has a problem in that a decrease in stress sensitivity or an increase in crystal defect is caused due to the progress of miniaturization of the semiconductor element.

Therefore, as a method of implementing high performance and low power consumption of MOSFET, research of transistors for implementing low power consumption by using a tunneling current, more specifically, a direct tunneling current rather than a diffusion current has been actively made. In a tunneling transistor using the tunneling current, it is possible to obtain a good gradient (sub-threshold slope) of a drain current with respect to a gate voltage in a sub-threshold range in transistor characteristics in comparison with a theoretical threshold value in the case using a diffusion current. Therefore, it is expected that it is possible to implement low power consumption.

DETAILED DESCRIPTION

Figure 1:
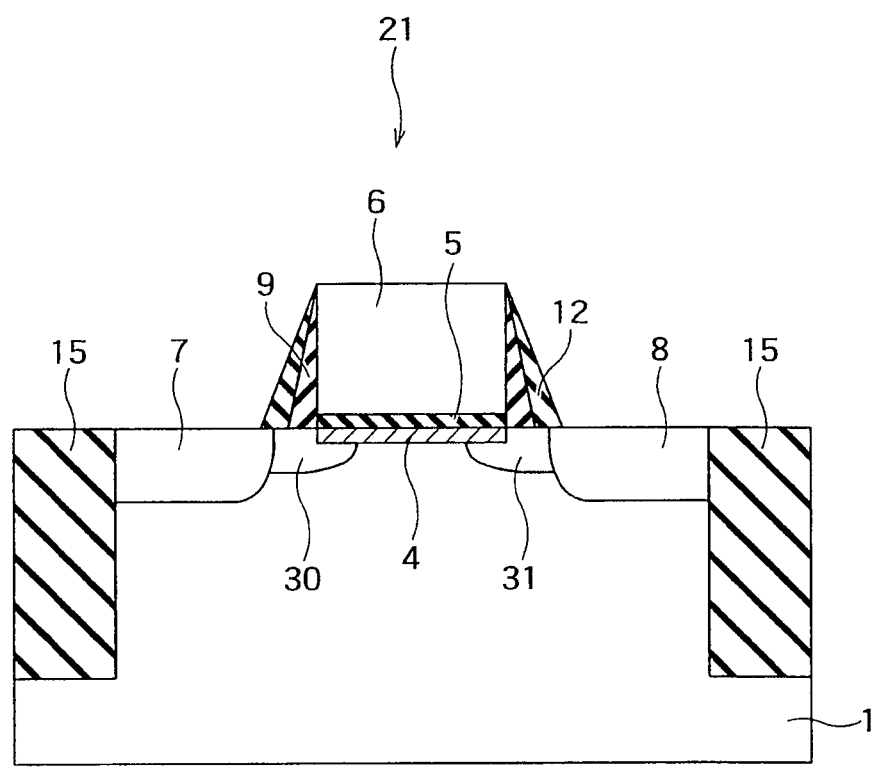
FIG. 1 is a cross-sectional diagram illustrating a semiconductor device according to an embodiment.

In one embodiment, a semiconductor device includes: a substrate; a gate electrode formed above the substrate; a gate insulating film formed under the gate electrode; a channel layer formed under the gate insulating film by using a channel layer material, the channel layer material being a material different from that of the substrate; a source region and a drain region formed in the substrate so as to interpose the channel layer therebetween in a channel direction; and a source extension layer formed in the substrate between the channel layer and the source region so as to be abutted on a source-side end portion of the channel layer, the source extension layer forming a heterointerface with the channel layer, the heterointerface being tunnel channel for carries.

Hereinafter, the embodiment will be described with reference to the drawings. However, the present invention is not limited to the embodiment. In addition, in the entire drawings, the same components are denoted by the same reference numerals, and the redundant description will not be repeated. In addition, the figures are provided for description of the invention and promotion of the understanding thereof, and although shapes, dimensions, ratios, or the like may be different from those of actual apparatuses, these may be appropriately designed and changed with reference the following description and well-known techniques.

A semiconductor device 21 according to the embodiment is described with reference to FIG. 1. FIG. 1 illustrates a cross section of the semiconductor device 21 in a channel direction thereof. Hereinafter, although a tunnel MOSFET is described as an example, the present invention is not limited to this type of semiconductor device, but the present invention may be used for other types of semiconductor devices.

As illustrated in FIG. 1, in the semiconductor device 21 according to the embodiment, a pair of STIs (Shallow Trench Isolations) 15 for element isolation is formed in the silicon substrate 1. Between a pair of the STIs 15, a gate electrode 6 is formed above the silicon substrate 1, a gate insulating film 5 is formed under the gate electrode 6, a channel layer 4 is formed under the gate insulating film 5 by using a channel layer material having a band gap which is wider than that of a material for the silicon substrate 1, a source region 7 and a drain region 8 formed in the silicon substrate 1 so as to interpose the channel layer 4 therebetween in a channel direction, a source extension layer 30 is formed in the silicon substrate 1 between the channel layer 4 and the source region 7 so as to overlap a source-side end portion of the channel layer 4, and a drain extension layer 31 is formed in the silicon substrate 1 between the channel layer 4 and the drain region 8 so as to overlap a drain-side end portion of the channel layer 4. In addition, each of the sides of the gate electrode 6 is covered with a first gate electrode sidewall 9 and a second gate electrode sidewall 12 in this order from the gate electrode 6 side.

In addition, in FIG. 1, although the semiconductor device 21 includes the drain extension layer 31 which is formed to overlap the drain-side end portion of the channel layer 4, in the embodiment, the drain extension layer 31 may not be provided, and the channel layer 4 and the drain region 8 may be configured to be abutted on each other.

In addition, more specifically, the gate electrode 6 is made of, for example, polycrystalline silicon, titanium nitride (TiN), tungsten (W), aluminum (Al), tantalum carbide (TaC), tantalum nitride (TaN), tantalum silicon nitride (TaSiN), or the like. In addition, the gate electrode 6 may contain impurities such as arsenic, and the concentration of impurities is, for example, $1.5e20\ cm^{-3}$. A channel-direction length of the gate electrode 6 is, for example, 100 nm.

The gate insulating film 5 is made of, for example, a silicon oxide, and a thickness thereof is, for example, 2 nm.

The channel layer 4 may be made of a silicon carbide. For example, the channel layer 4 may be made of a silicon carbide containing 50 at % carbon. Since the band gap of the silicon carbide is changed by changing the crystalline structure thereof, silicon carbides having different crystalline structures such as 4H-SiC, 3C-SiC, and 6H-SiC may be used according to the use thereof. More specifically, the 4H-SiC and the 6H-SIC have hexagonal structures, where the crystalline structures have a "4 period" and a "6 period", respectively. In addition, the 3C-SiC has a cubic structure. Herein, the description is made on the case using the 4H-SiC. In addition, a thickness of the channel layer 4 is, for example, 5 nm.

In order to equalize a work function of the channel layer 4 to that of the source extension layer 30, the channel layer 4 may contain impurities such as phosphorus, and the concentration of impurities is, for example, 6e17 cm$^{-3}$.

The source region 7 and the drain region 8 which are formed in the silicon substrate 1 so as to interpose the channel layer 4 therebetween in the channel direction contain impurities such as arsenic having a predetermined concentration.

Each of the source extension region 30 and the drain extension region 31 overlaps the channel layer 4. In other words, each of the source extension region 30 and the drain extension region 31 is abutted on a portion of a side surface and a portion of a lower surface of the channel layer 4. A channel-direction overlap length of the source extension region 30 or the drain extension region 31 with respect to the channel layer 4 is formed in a range of about 5% to about 10% of the channel-direction length of the gate electrode 6 by taking into consideration a high driving voltage of the semiconductor device 21 and balance to other characteristics of the semiconductor device 21. For example, if the channel-direction length of the gate electrode 6 is 100 nm, the channel-direction overlap length of the source extension region 30 or the drain extension region 31 with respect to the channel layer 4 becomes in a range of 5 nm to 10 nm. In addition, a thickness of the source extension region 30 and the drain extension region 31 overlapping the channel layer 4 is, for example, 5 nm.

The source extension region 30 and the drain extension region 31 may contain impurities such as arsenic, and the concentration of impurities is, for example, 1e19 cm$^{-3}$.

In addition, the first gate electrode sidewall 9 with which the sides of the gate electrode 6 is covered is constructed with, for example, a silicon oxide film having a thickness of 2 nm. In addition, the second gate electrode sidewall with which the gate electrode 6 is covered through the first gate electrode sidewall 9 is constructed with, for example, a silicon oxide film having a thickness of 3 nm and a silicon nitride film having a thickness of 10 nm.

Next, a method of manufacturing the semiconductor device 21 according to the embodiment is described with reference to FIGS. 2A to 2F. FIGS. 2A to 2F are process cross-sectional diagrams for explaining a method of manufacturing an n type MOSFET (the semiconductor device) 21 according to the embodiment. Similarly to FIG. 1, these figures correspond to the cross section of the semiconductor device 21 in the channel direction.

Figure 2A:
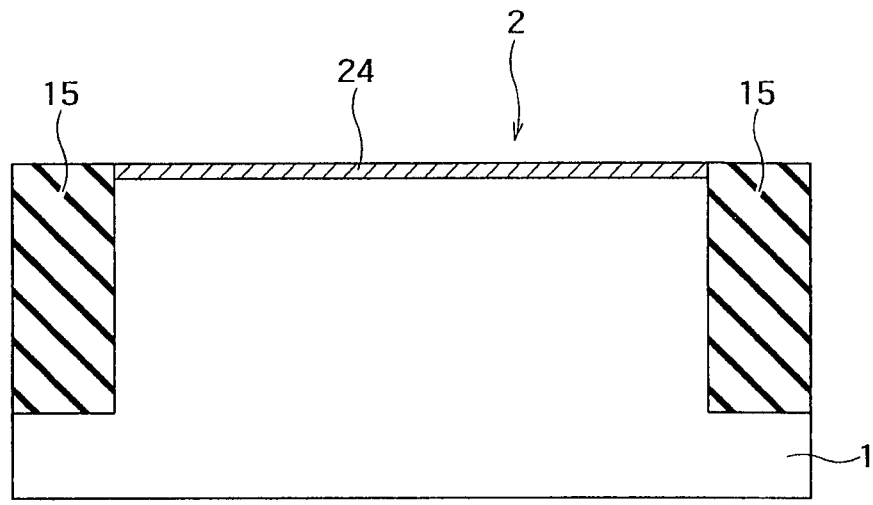
FIGS. 2A to 2F are cross-sectional diagrams for explaining processes of manufacturing a semiconductor device according to an embodiment.

As illustrated in FIG. 2A, in order to electrically isolate an element formation area 2 of the silicon substrate 1, a pair of the STIs 15 is formed so as to interpose the element formation area 2 therebetween. Next, in order to form a channel region on a surface of the silicon substrate 1, for example, boron is injected into the element formation area 2 of the silicon substrate 1 in the condition where the acceleration voltage is 2 keV and the dose amount is 3e13 cm$^{-2}$. In addition, in this state, a vapor phase epitaxial growing process is performed, for example, at a temperature of 1350° C. by using SiH$_4$ and C$_3$H$_8$ as source gases, so that a film 24 for the channel layer, which is made of a silicon carbide, is formed so as to have a thickness, for example, 5 nm. Next, in this state, phosphorus is injected into the film 24 for the channel layer in the condition where the acceleration voltage is 1 keV and the dose amount is 5e13cm$^{-2}$, so that the film 24 for the channel layer is formed as an n type.

Figure 2B:
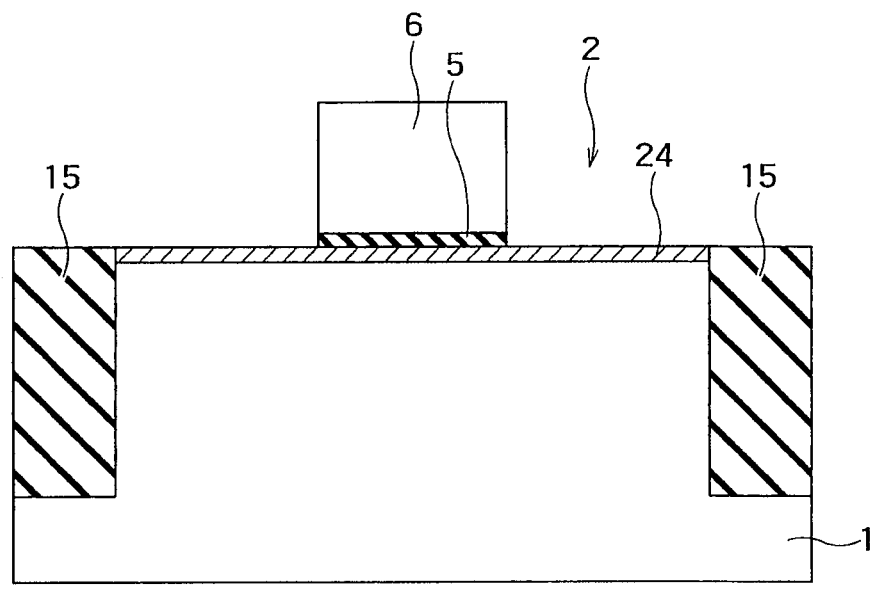

Next, as illustrated in FIG. 2B, the gate insulating film 5 is formed on the element formation area 2 of the silicon substrate 1 so as to have a thickness of, for example, 2 nm by using a thermal oxidation method or the like. Next, the gate electrode 6 made of a polycrystalline silicon is deposited on the gate insulating film 5 to have a desired thickness by using a CVD (Chemical Vapor Deposition) method. The gate electrode 6 is formed, for example, by using an RIE (Reactive Ion Etching) method using resist or the like as a mask.

Figure 2C:
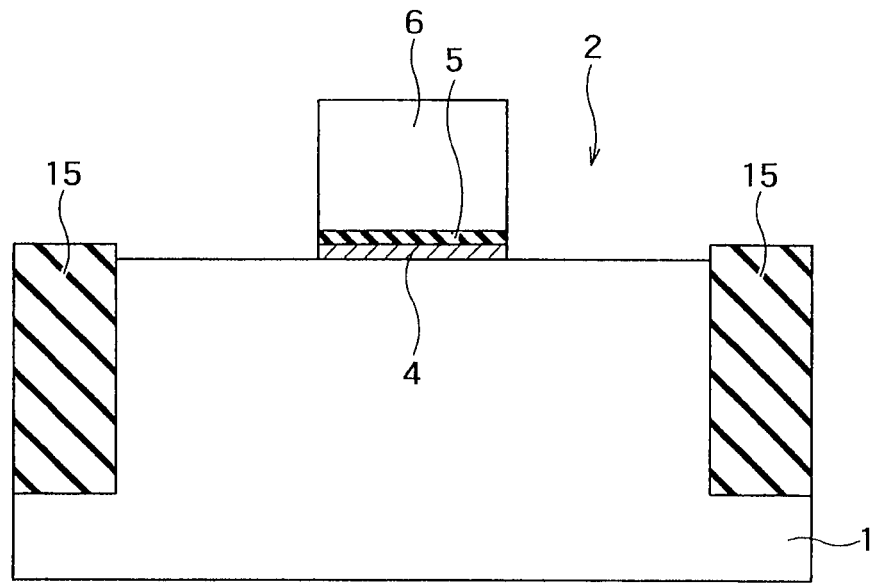

Next, as illustrated in FIG. 2C, in order to remove the portion of the film 24 for the channel layer, with which a surface of the source region 7 and a surface of the drain region 8 are covered, from the element formation area 2, an anisotropic etching is performed on the film 24 for the channel layer by using the RIE method using the gate electrode 6 as a mask, so that the channel layer 4 is formed.

Figure 2D:
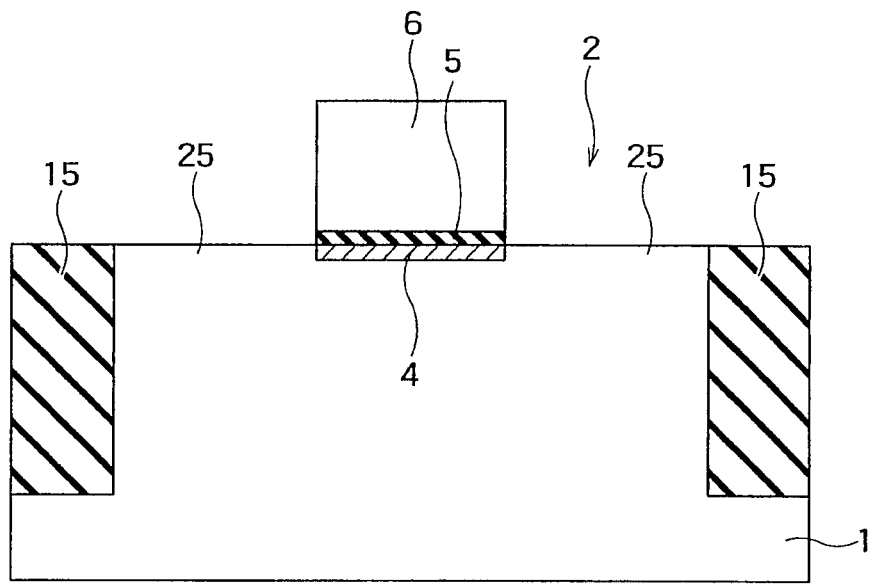

In addition, as illustrated in FIG. 2D, in order to make up for the loss of the surface of the silicon substrate 1 in the element formation area 2 caused by the etching of the film 24 for the channel layer, a silicon epitaxial growing process is performed on the surface of the silicon substrate 1 in the source region 7 and the drain region 8. Accordingly, a silicon layer 25 having a thickness of, for example, 5 nm is formed on the surface of the silicon substrate 1 in the source region 7 and the drain region 8.

Figure 2E:
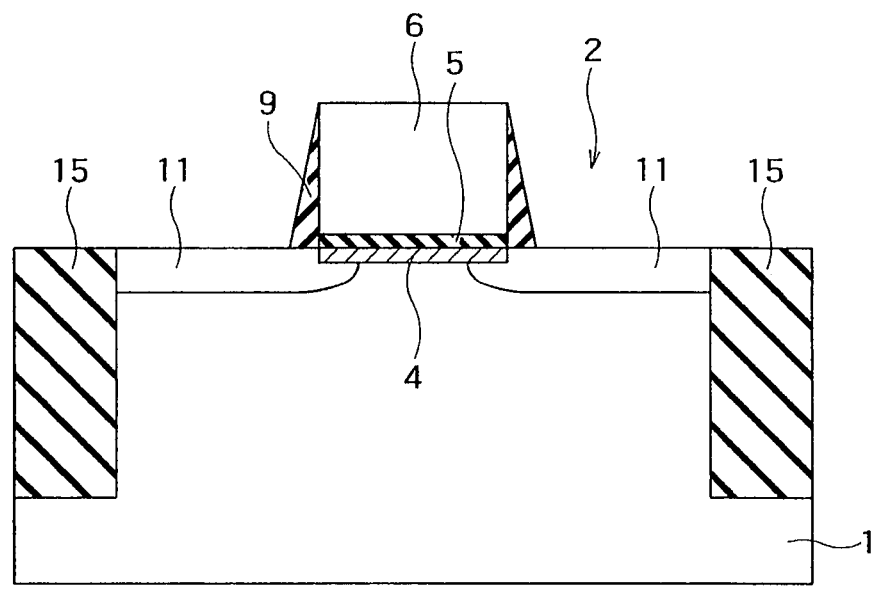

Next, as illustrated in FIG. 2E, for example, a silicon oxide is deposited to have a thickness of 2 nm by a CVD method or the like so as to allow the sidewall of the gate electrode 9 to be covered. In addition, an anisotropic etching process is performed on the silicon oxide by using, for example, an RIE method, so that the first gate electrode sidewall 9 is formed. Next, in this state, for example, arsenic is injected into the source region 7 and the drain region 8 of the silicon substrate 1 in the condition where the acceleration voltage is 1 keV and the dose amount is 1e15 cm$^{-2}$, so that an impurity diffusion layer 11 is formed. A portion of the impurity diffusion layer 11 overlapping the gate electrode 6 becomes the source extension region 30 and the drain extension region 31.

Figure 2F:
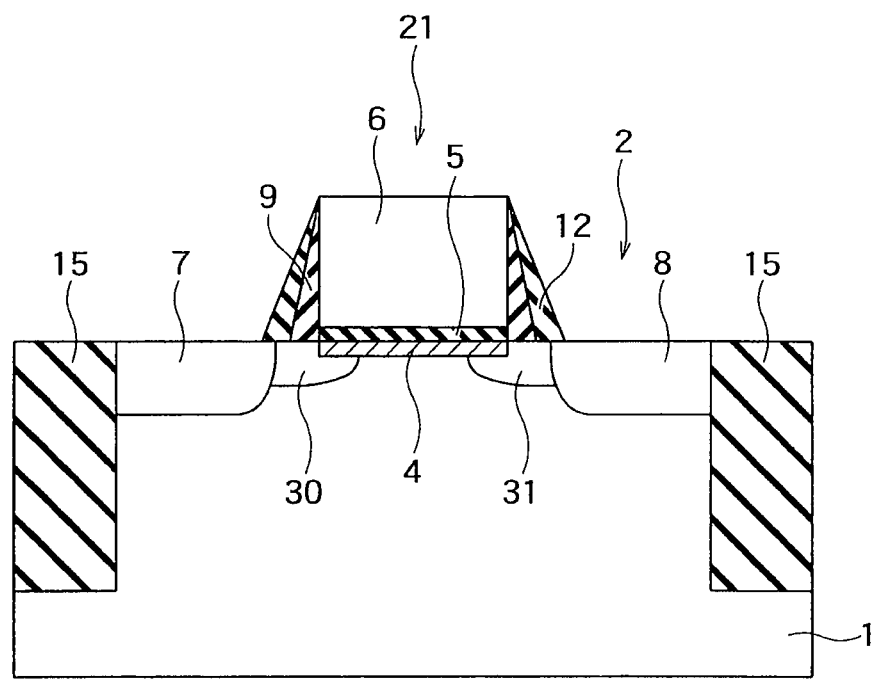

Next, as illustrated in FIG. 2F, in order to form the second gate electrode sidewall 12, for example, a silicon oxide is deposited to have a thickness of 3 nm by using a CVD method or the like, and a silicon nitride is deposited to have a thickness of 10 nm by using a CVD method or the like. Next, an anisotropic etching process is performed on the silicon oxide and the silicon nitride by using, for example, an RIE method. In this state, in order to form the source region 7 and the drain region 8, ion injection is performed on a portion of the impurity diffusion layer 11. At this time, impurities such as arsenic are injected in the condition where the acceleration voltage is 20 keV and the dose amount is 3e15 cm$^{-2}$. Next, an annealing process for activating the injected impurities is performed by using spike anneal, for example, at 1050° C., so that the semiconductor device 21 is formed.

The operation principle of the semiconductor device 21 is different from that of a general MOSFET where an inversion layer is formed in the channel region for the operation thereof. The operation of the semiconductor device 21 according to the embodiment is described with reference to FIG. 3 illustrating a band diagram of the semiconductor device 21 according to the embodiment.

Figure 3:
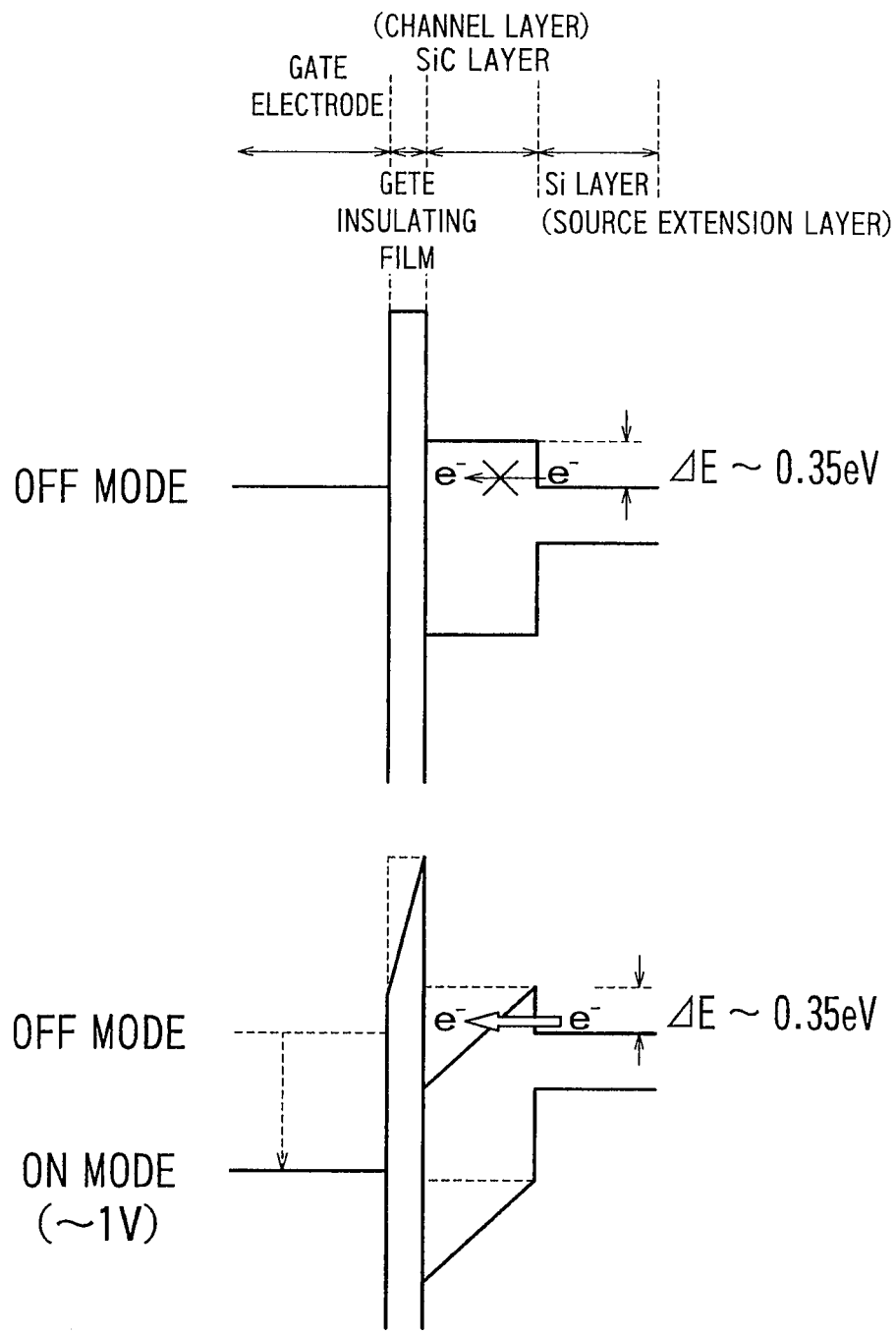
FIG. 3 is a band diagram of a semiconductor device according to an embodiment.

As illustrated in the upper portion (a band diagram during the OFF mode of the semiconductor device 21) of FIG. 3, a silicon carbide having an energy gap which is wider than that of silicon is used as the channel layer 4, so that a band barrier is formed in a heterointerface between the channel layer 4 made of a silicon carbide and the source extension region 30 made of a silicon.

Next, as illustrated in the lower portion (a band diagram during the ON mode of the semiconductor device 21, which is indicated by a solid line in the lower portion of FIG. 3) of FIG. 3, a voltage is applied to the gate electrode 6, so that the band barrier in the heterointerface between the channel layer 4 and the source extension region 30 becomes narrow. As a result, carriers in the source extension region 30 can override the narrow band barrier to directly tunnel into the channel layer 4. The directly tunneling carriers flow through the channel layer 4 toward the drain region 8. In this manner, the semiconductor device is operated by using a tunneling current rather than a diffusion current, so that it is possible to sharply increase a sub-threshold slope of the drain current with respect to the gate voltage in a sub-threshold range in transistor characteristics without temperature dependency. In other words, it is possible to obtain a good value of the sub-threshold slope in comparison with a theoretical limit value in the case using a diffusion current, so that it is possible to implement low power consumption of the semiconductor device 21.

In addition, in the embodiment, the source extension region 30 is configured to overlap the channel layer 4, so that the region through which a tunneling current is flowed from the source extension region 30 into the channel layer 4 can be widened. Therefore, it is possible to implement a high driving current in comparison with semiconductor devices using a tunneling current.

In other words, according to the embodiment, it is possible to provide the semiconductor device 21 capable of achieving both of low power consumption and a high current driving force. Therefore, it is possible to improve MOSFET characteristics.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A semiconductor device comprising:
   a substrate;
   a gate electrode formed above the substrate;
   a gate insulating film formed under the gate electrode;
   a channel layer formed under the gate insulating film by using a channel layer material, the channel layer material being a material different from that of the substrate;
   a source region and a drain region formed in the substrate so as to interpose the channel layer therebetween in a channel direction; and
   a source extension layer formed in the substrate between the channel layer and the source region so as to be abutted on a source-side end portion of the channel layer, the source extension layer forming a heterointerface with the channel layer, and the heterointerface being a tunnel channel for carries and extending in a first direction parallel to a surface of the substrate, the surface of the substrate being opposed to a lower surface of the gate insulating film via the channel layer,
   wherein the material of the substrate and the channel layer material respectively have first and second band gaps to cause the carriers to flow in a second direction perpendicular to the surface of the substrate through the heterointerface.

2. The semiconductor device of claim 1, wherein the second band gap is wider than the first band gap.

3. The semiconductor device of claim 1, wherein the source extension layer is abutted on portions of a side surface and a lower surface of the channel layer.

4. The semiconductor device of claim 1, wherein a channel-direction overlap length of the source extension layer with respect to the channel layer is in a range of 5% to 10% of a channel-direction length of the channel layer.

5. The semiconductor device of claim 1, wherein the substrate is made of silicon, and the channel layer material is made of a silicon carbide.

6. The semiconductor device of claim 5, wherein the channel layer material is made of at least one of 3C—SiC, 4H—SiC, and 6H—SiC.

7. The semiconductor device of claim 1, further comprising: a drain extension layer formed in the substrate between the channel layer and the drain region so as to be abutted on a drain-side end portion of the channel layer, the drain extension layer forming a heterointerface with the channel layer, the heterointerface being a tunnel channel for the carries and extending in the first direction.

8. The semiconductor device of claim 7, wherein the drain extension layer is abutted on portions of a side surface and a lower surface of the channel layer.

9. The semiconductor device of claim 7, wherein a channel-direction overlap length of the drain extension layer with respect to the channel layer is in a range of 5% to 10% of a channel-direction length of the channel layer.

* * * * *